(12) United States Patent
Lin et al.

(10) Patent No.: US 8,179,162 B2
(45) Date of Patent: May 15, 2012

(54) PHASE-LOCK ASSISTANT CIRCUITRY

(75) Inventors: Chih-Chang Lin, San Jose, CA (US);
Chan-Hong Chern, Palo Alto, CA (US);
Steven Swei, Fremont, CA (US);
Ming-Chieh Huang, San Jose, CA (US);
Tien-Chun Yang, San Jose, CA (US)

(73) Assignee: Taiwan Semiconductor Manufacturing Company, Ltd.

( * ) Notice: Subject to any disclaimer, the term of this patent is extended or adjusted under 35 U.S.C. 154(b) by 0 days.

(21) Appl. No.: 12/835,130

(22) Filed: Jul. 13, 2010

(65) Prior Publication Data

US 2012/0013374 A1 Jan. 19, 2012

(51) Int. Cl.
*H03D 13/00* (2006.01)
*H03L 7/06* (2006.01)

(52) U.S. Cl. ................... 327/5; 327/156; 327/3

(58) Field of Classification Search ............. 327/2, 3
See application file for complete search history.

(56) References Cited

U.S. PATENT DOCUMENTS

| | | | |
|---|---|---|---|
| 6,026,134 A * | 2/2000 | Duffy et al. | 375/376 |
| 6,249,159 B1 * | 6/2001 | Johnson | 327/157 |
| 6,259,278 B1 * | 7/2001 | Huang | 327/12 |
| 6,442,225 B1 * | 8/2002 | Huang | 375/376 |
| 6,456,128 B1 * | 9/2002 | Nakamura | 327/149 |
| 6,560,306 B1 * | 5/2003 | Duffy et al. | 375/376 |
| 7,078,938 B2 * | 7/2006 | Kim | 327/2 |
| 7,136,443 B2 * | 11/2006 | Vallet et al. | 375/371 |
| 7,330,058 B2 * | 2/2008 | Lin | 327/157 |
| 7,492,849 B2 * | 2/2009 | On et al. | 375/376 |
| 2007/0001713 A1 * | 1/2007 | Lin | 327/3 |

OTHER PUBLICATIONS

Muthali, Harish S., et al., "A CMOS 10-Gb/s SONET Transceiver", IEEE Journal of Solid-State Circuits, vol. 39, No. 7, Jul. 2004, pp. 1026-1033.

* cited by examiner

*Primary Examiner* — Ryan Jager
(74) *Attorney, Agent, or Firm* — Lowe Hauptman Ham & Berner, LLP

(57) ABSTRACT

Some embodiments regard a circuit comprising: a first circuit configured to lock a frequency of an output clock to a frequency of a reference clock; a second circuit configured to align an input signal to a phase clock of the output clock; a third circuit configured to use a first set of phase clocks of the output clock and a second set of phase clocks of the output clock to improve alignment of the input signal to the phase clock of the output clock; and a lock detection circuit configured to turn on the first circuit when the frequency of the output clock is not locked to the frequency of the reference clock; and to turn off the first circuit and to turn on the second circuit and the third circuit when the frequency of the output clock is locked to the frequency of the reference clock.

19 Claims, 12 Drawing Sheets

FIG. 6A — 600A

| DATA | CLK_1 | Q_1 |
|---|---|---|
| 1 | RISE | 1 |
| 0 | RISE | 0 |
| X | 0 | UC |
| X | 1 | UC |

FIG. 6B — 600B

| DATA | CLK_2 | Q_2 |
|---|---|---|
| 1 | RISE | 1 |
| 0 | RISE | 0 |
| X | 0 | UC |
| X | 1 | UC |

FIG. 6C — 600C

| DATA | CLK_3 | Q_3 |
|---|---|---|
| 1 | RISE | 1 |
| 0 | RISE | 0 |
| X | 0 | UC |
| X | 1 | UC |

FIG. 6D — 600D

| Q_1 | Q_2 | Q_3 | CLK_1 | LATE | EARLY | TOGGLE |
|---|---|---|---|---|---|---|
| 1 | 0 | 0 | RISE | 1 | 0 | 1 |
| 1 | 0 | 1 | RISE | 0 | 1 | 1 |
| 1 | 1 | 0 | RISE | 0 | 0 | 0 |
| 0 | 0 | 1 | RISE | 0 | 0 | 0 |
| 0 | 1 | 1 | RISE | 0 | 0 | 0 |
| 0 | 1 | 0 | RISE | 1 | 1 | 1 |
| X | X | X | 0 | UC | UC | UC |
| X | X | X | 1 | UC | UC | UC |

1000A

| A | CLK_0 | A_FF |
|---|-------|------|
| 1 | RISE  | 1    |
| 0 | RISE  | 0    |
| X | 0     | UC   |
| X | 1     | UC   |

| B | CLK_0 | B_FF |
|---|-------|------|
| 1 | RISE  | 1    |
| 0 | RISE  | 0    |
| X | 0     | UC   |
| X | 1     | UC   |

| A_FF | B_FF | C | D | Q |
|------|------|---|---|---|
| 0    | X    | X | X | 0 |
| X    | 0    | X | X | 0 |
| X    | X    | 0 | X | 0 |
| X    | X    | X | 0 | 0 |
| 1    | 1    | 1 | 1 | 1 |

FIG. 10C

| UP_0 | UP_1 | CLK_0 | UP_INT |
|---|---|---|---|
| X | X | 0 | UC |
| X | X | 1 | UC |
| 1 | X | RISE | 0 |
| 0 | 1 | RISE | 1 |
| 0 | 0 | RISE | UC |

FIG. 12A

| UP_INT | TOGGLE | CLK_0 | UP |
|---|---|---|---|
| X | X | 0 | UC |
| X | X | 1 | UC |
| 1 | 1 | RISE | 1 |
| 0 | 0 | RISE | 0 |
| 1 | 0 | RISE | 0 |
| 0 | 0 | RISE | 0 |

FIG. 12B

| DN_0 | DN_1 | CLK_0 | DN_INT |
|---|---|---|---|
| X | X | 0 | UC |
| X | X | 1 | UC |
| 1 | X | RISE | 0 |
| 0 | 1 | RISE | 1 |
| 0 | 0 | RISE | UC |

FIG. 12C

| DN_INT | TOGGLE | CLK_0 | UP |
|---|---|---|---|
| X | X | 0 | UC |
| X | X | 1 | UC |
| 1 | 1 | RISE | 1 |
| 0 | 0 | RISE | 0 |
| 1 | 0 | RISE | 0 |
| 0 | 0 | RISE | 0 |

FIG. 12D

PHASE-LOCK ASSISTANT CIRCUITRY

TECHNICAL FIELD

The present disclosure is generally related to phase-lock-loop based clock-data recovery (PLL-based CDR) circuitry, and more specifically to a phase-lock assistant circuit.

BACKGROUND

The clock-data recovery (CDR) circuitry based on a phase-lock loop (PLL) usually includes two loops. A first loop brings the frequency of the voltage-controlled oscillator (VCO) (e.g., the CDR frequency) closer to the frequency of the input data (e.g., the input frequency) while a second loop locks the phase of the VCO into that of the input data. In some approaches related to the two-loop structure using the spread spectrum clock (SSC), however, if the input frequency varies at the transition from the first loop to the second loop, the VCO does not lock into the input data. As a result, there is a need to solve the above problem.

BRIEF DESCRIPTION OF THE DRAWINGS

The details of one or more embodiments of the disclosure are set forth in the accompanying drawings and the description below. Other features and advantages will be apparent from the description, drawings, and claims.

FIGS. 6A-6D show truth tables illustrating an operation of the circuit in FIG. 5, in accordance with some embodiments.

FIGS. 10A-10C show truth tables illustrating an operation of the circuit in FIG. 8, in accordance with some embodiments.

FIGS. 12A-12D show truth tables illustrating an operation of the circuit in FIG. 11, in accordance with some embodiments.

Like reference symbols in the various drawings indicate like elements.

DETAILED DESCRIPTION

Figure 1:
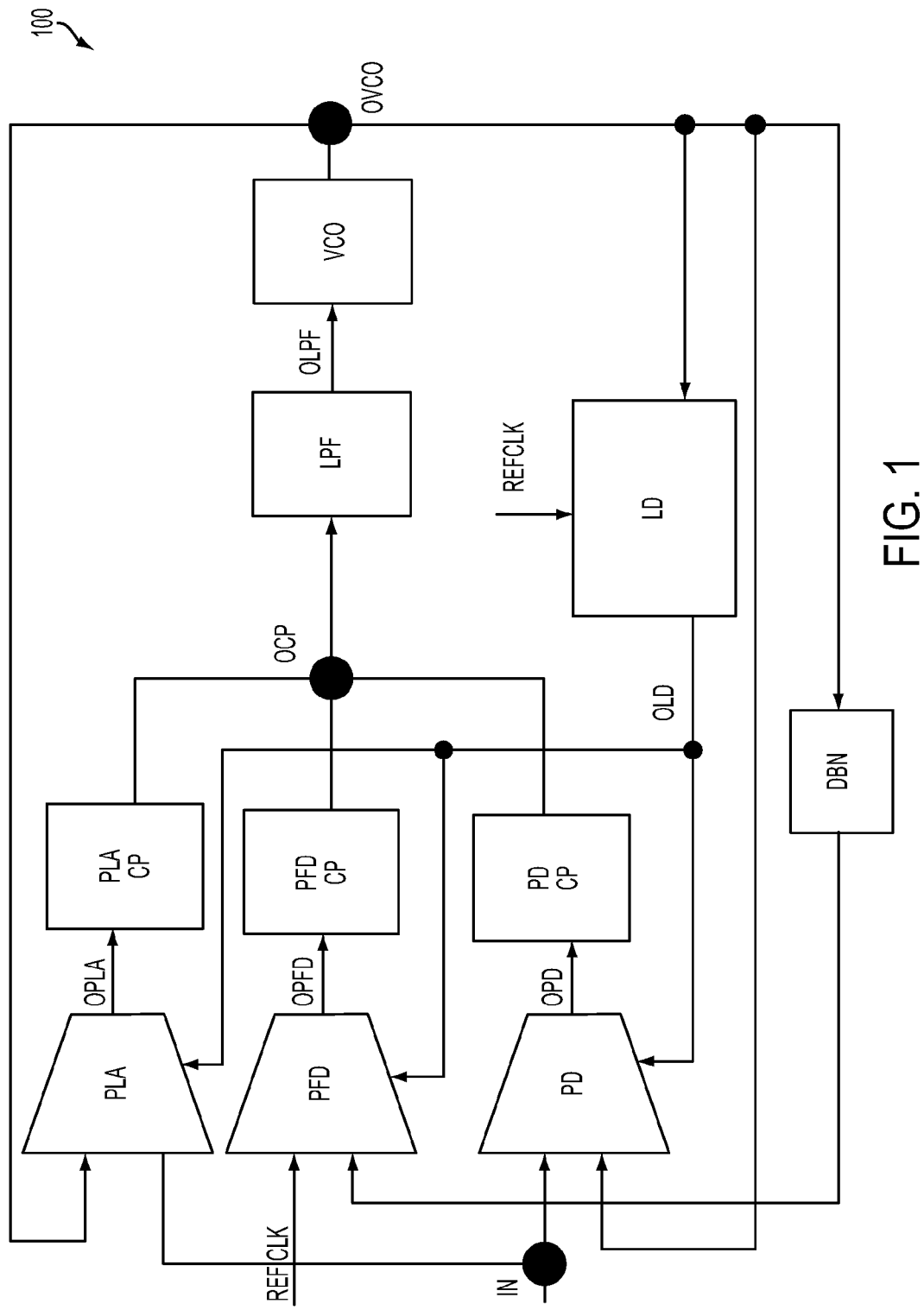
FIG. 1 is a diagram of an illustrative circuit, in accordance with some embodiments.

Embodiments, or examples, illustrated in the drawings are now disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. Some embodiments include a phase-lock assistant circuit that aligns the input data and the VCO output to improve the phase lock between the input data and the VCO output. Some embodiments are used in applications with a SSC input and/or where there is a deviation between the frequency of the input data and the reference clock, but the input and the VCO output are also locked.

Exemplary Circuit

FIG. 1 is a diagram of an exemplary CDR circuit 100 that uses some embodiments. CDR circuit 100 generates a clock (e.g., signal) OVCO based on the input data IN. Those skilled in the art will recognize that a first signal (e.g., a clock) having a frequency higher than that of a second signal (e.g., data) indicates that the clock is faster than the data. Similarly, the data having a frequency lower than that of the clock is slower than the clock. In contrast, the clock is earlier than the data if a relevant edge (e.g., the rising edge) of the clock is before a relevant edge of the data.

In some embodiments, signal OVCO generates eight phase clocks corresponding to eight phases, including phase 0° (e.g., Clk_0), phase 45° (e.g., Clk_45), phase 90° (e.g., Clk_90), phase 135° (e.g., Clk_135), phase 180° (e.g., Clk_180), phase 225° (e.g., Clk_225), phase 270° (e.g., Clk_270), and phase 315° (e.g., Clk_315). Clocks Clk_0, Clk_45, Clk_90, Clk_135, Clk_180, Clk_225, Clk_270 and Clk_315 run at the same frequency but at different phases (e.g., different times). In another words, clocks Clk_0, Clk_45, Clk_90, Clk_135, Clk_180, Clk_225, Clk_270 and Clk_315 are in an order of being early to being late. For example, clock Clk_0 transitions earlier than clock Clk_45, clock Clk_45 transitions earlier than clock Clk_90, clock Clk_90 transitions earlier than clock Clk_135, etc.

Divide-by-N circuit DBN divides the frequency of signal OVCO (e.g., frequency FOVCO, not labeled) by an integer N, resulting in frequency FVCODBN where FVCODBN=FOVCO/N.

Phase frequency detector PFD enables output frequency FVCODBN of circuit DBN to be substantially close to (e.g., the same as) the frequency of the reference clock REFCLK (e.g., frequency FREFCLK). For example, if clock OVCO is faster than clock REFCLK (e.g., frequency FVCODBN is higher than frequency FREFCLK), then phase frequency detector PFD generates a "down" signal OPFD for charge pump PFD CP to drive low pass filter LPF to decrease frequency FVCO of oscillator VCO and thus frequency FVCODBN. If clock OVCO is slower than clock REFCLK (e.g., frequency FVCODBN is lower than frequency FREFCLK), phase frequency detector PFD generates an "up" signal OPFD for charge pump PFD CP to drive low pass filter LPF to increase frequency FVCO and thus frequency FVCODBN.

Phase detector PD enables the phase of input data IN (e.g., PHIN) to be close to (e.g., the same as) the 90° phase of clock OVCO (i.e., the relevant data edge DE of input data IN to be close to (e.g., aligned with) the rising edge of clock Clk_90). If clock OVCO is earlier than input data IN, phase detector PD generates a "down" signal OPD for charge pump PD CP to drive low pass filter LPF to decrease frequency FVCO. But if clock OVCO is later than input data IN, phase detector PD generates an "up" signal OPD for charge pump PD CP to drive low pass filter LPF to increase frequency FVCO. Decreasing or increasing frequency FVCO respectively decreases or increases the frequency of clock Clk_90, enabling the data edge DE to be aligned with the rising edge of clock Clk_90 (e.g., phase locking input data IN to clock Clk_90).

In some situations, using only phase detector PD without a phase assistant PLA to phase lock input data IN and clock Clk_90 enables a data edge DE to be close to but not completely aligned with the rising edge of clock Clk_90. Phase lock assistant PLA improves the phase lock, e.g., enables data edge DE to be (substantially) aligned with the rising edge of clock Clk_90. For example, If clock Clk_90 is earlier than input data IN, phase lock assistant PLA generates a "down" signal OPLA for charge pump PLA CP to drive low pass filter LPF to decrease frequency FVCO to slow down clock OVCO or clock Clk_90, and thus improves the phase lock. But if clock OVCO is later than input data IN, phase lock assistant PLA generates an "up" signal OPLA for charge pump PLA CP to drive low pass filter LPF to increase frequency FVCO to speed up clock OVCO or clock Clk_90, and thus improve the phase lock.

The charge pumps PLA CP, PFD CP, and PD CP function with the phase lock assistant PLA, phase frequency detector PFD, and phase detector PD, respectively. One of the charge pumps PLA CP, PFD CP, or PD CP, depending on the respective input signals OPLA, OPFD, or OPD, generates the appropriate signal OCP corresponding to each respective signal OPLA, OPFD, or OPD. FIG. 1 shows three charge pumps PLA CP, PFD CP, and PD CP in accordance with some embodiments, but, in accordance with some further embodiments, one charge pump (e.g., a charge pump CP) is used by all three phase lock assistant PLA, phase frequency detector PFD, and phase detector PD. For example, a multiplexer is used to select and thus provides one of the outputs OPLA, OPFD, and OPD of the respective phase lock assistant PLA, phase frequency detector PFD, and phase detector PD to charge pump CP.

Signal OCP enables low pass filter LPF to generate signal OLPF to increase/decrease frequency FOVCO.

Lock detector LD compares signal REFCLK and OVCO and generates a signal OLD to control phase lock assistant PLA, phase frequency detector PFD, and phase detector PD. In some embodiments, if frequency FVCODBN is locked to frequency FREFCLK, lock detector LD generates a "locked" signal OLD to turn off phase frequency detector PFD and turn on simultaneously phase lock assistant PLA and phase detector PD. But if frequency FVCODBN is not locked to frequency FREFCLK, lock detector LD generates a "not locked" signal OLD turn on phase frequency detector PFD and turn off simultaneously phase lock assistant PLA and phase detector PD.

In some embodiments, frequency FVCODBN is locked to the frequency of input data IN (e.g., frequency FIN), and phase PHIN is aligned with (e.g., locked to) clock Clk_90 (e.g., the data edge DE is aligned with the rising edge of clock Clk_90). When phase PHIN is locked to clock Clk_90, input data IN is latched by clock OVCO having sufficient setup and hold time for clock OVCO.

Determining the Timing Relationship Between the Data and the Clock

Figure 2:
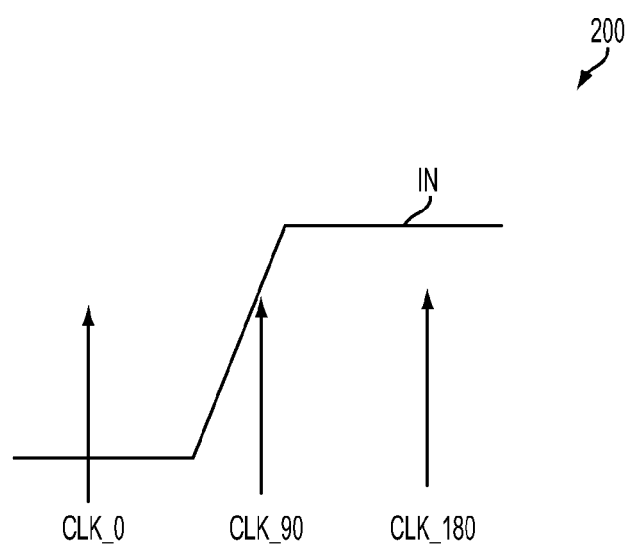
FIG. 2 is a graph of a waveform illustrating how a set of three phase clocks and a data signal are used in determining the relative timing relationship between the clock and the data signal in FIG. 1, in accordance with some embodiments.

FIG. 2 is a diagram of waveform 200 illustrating an operation of phase detector PD, in accordance with some embodiments. Phase detector PD samples input data IN by the rising edge of clock OVCO at three phases 0°, 90°, and 180° represented by three respective clocks Clk_0, Clk_90, and Clk_180. In some embodiments, if the sampling result (e.g., RSMP90) of clock Clk_90 sampling input data IN is the same as the sampling result RSMP0 of clock Clk_0 sampling input data IN, clock OVCO is earlier than input data IN, but if the sampling result RSMP90 is the same as the sampling result RSM180 of clock Clk_180 sampling input data IN then clock OVCO is later than input data IN. In the illustration of FIG. 2, the sampling result RSMP0 is a logical "0" (e.g., a low logic level, a Low). The sampling result RSMP180 a logical "1" (e.g., a high logic level, a High). As a result, if the sampling result RSMP90 is High, i.e., the same as the sampling result RSMP180, then clock OVCO is later than input data IN. But if the sampling result RSMP90 is Low, i.e., the same as the sampling result RSMP0, then clock OVCO is earlier than input data IN.

Figure 3:
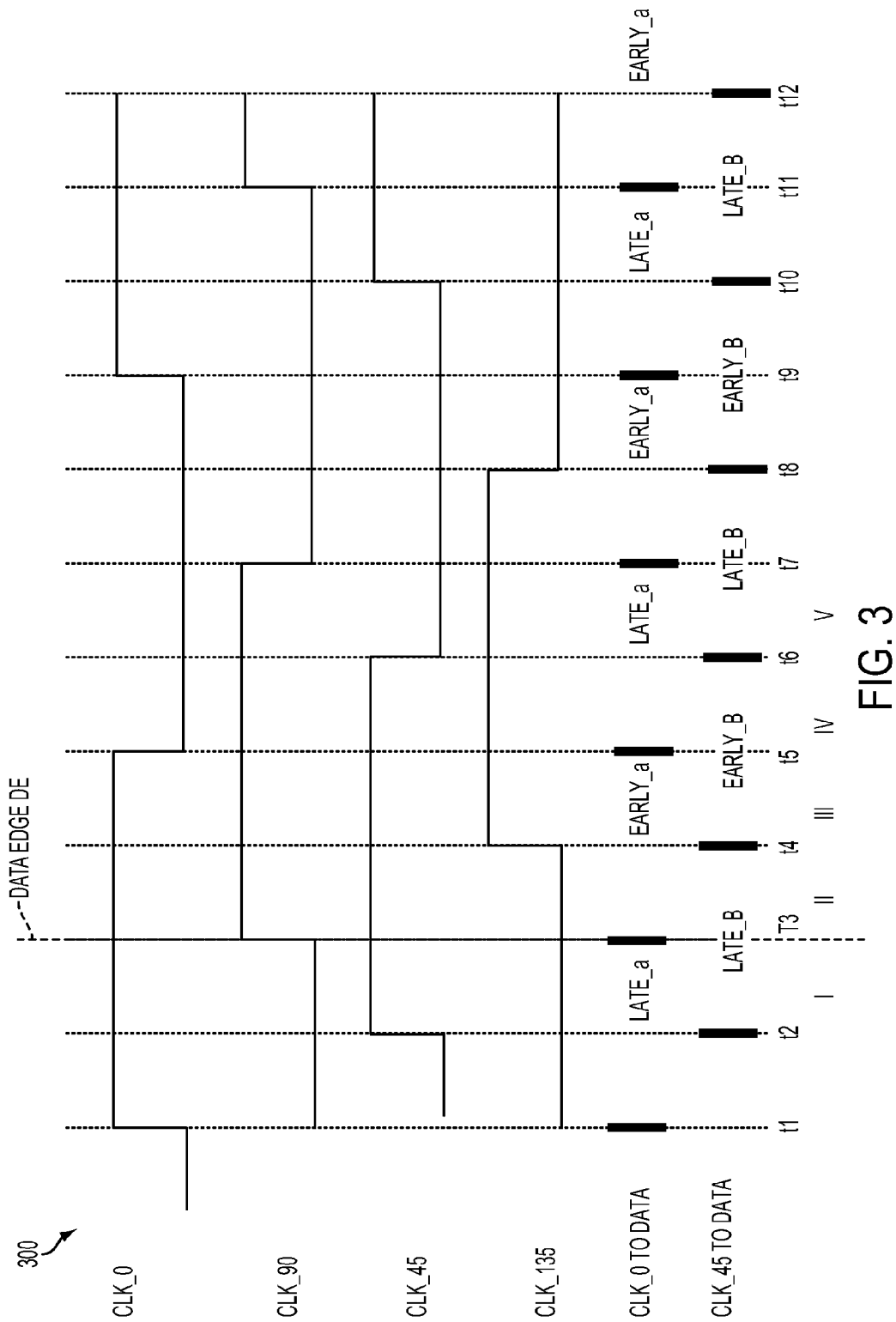
FIG. 3 is a graph of waveforms illustrating how the relative timing relationship of the clock and the data signal in FIG. 1 is determined using multiple clock signals, in accordance with some embodiments.

FIG. 3 is a graph of waveforms illustrating the timing relationship (e.g., how late/early) between clock OVCO and input data IN based on different phase clocks of clock OVCO, in accordance with some embodiments. In some embodiments, input data IN is phase locked to the 90° phase of signal OVCO. Stated another way, the data edge DE is aligned to the rising edge of clock Clk_90, but so that the phase detector PD operating in the areas neighboring the rising edge of clock Clk_90 (e.g., regions I and II) is not disturbed, the phase lock assistant PLA is configured to operate in regions III and IV (e.g., the signal comparisons are performed in regions III and IV). Even though the comparison regions are shifted from regions I and II to regions III and IV, the comparison results indicating the timing relationship between clocks OVCO and input data IN are the same as if the comparisons are performed in the regions I and II.

The line "Clk_0 to data" showing regions late_a and early_a indicates whether clock OVCO is late or early with respect to input data IN using the rising edge of clock Clk_0 as a reference. The regions late_a and early_a are determined using clocks Clk_0, Clk_90 and Clk_180 sampling input data IN as illustrated in FIG. 2. For simplicity, clock Clk_180 is not shown. For example, if data edge DE is between times t1 and t3, t5 and t7, and t9 and t11, clock OVCO is later than input data IN. If, however, data edge DE is between times t3 and t5, t7 and t9, clock OVCO is earlier than input data IN.

The line "Clk_45 to data" showing regions late_b and early_b indicates whether clock OVCO is late or early with respect to input data IN using the rising edge of clock Clk_45 as a reference. The regions late_b and early_b are determined using clocks Clk_45, Clk_135 and Clk_225 sampling input data IN as illustrated in FIG. 2 wherein clocks Clk_45, Clk_135 and Clk_225 correspond to clocks Clk_0, Clk_90 and Clk_180, respectively. For simplicity, clock Clk_225 is not shown. For example, if data edge DE is between times t2 and t4, t6 and t8, and t10 and t12, clock OVCO is later than input data IN. If the data edge DE, however, is between times t4 and t6, t8 and t10, clock OVCO is earlier than input data IN.

In some embodiments, a combination of the regions late_a, early_a, late_b, and early_b are used to determine the timing relationship (e.g., late/early) between clock OVCO and input data IN and the moving direction of input data IN with respect to clock OVCO. For example, if using the two sets of clocks Clk_0, Clk_90 and Clk_180, and Clk_45, Clk_135 and Clk_225 to sample data edge DE, and the results reveal that data edge DE is in the region III (e.g., between times t4 and t5 or regions early_a and early_b) in a first clock cycle (e.g., cycle n−1) and in the region IV (e.g., between times t5 and t6 or in regions late_a and early_b) in a subsequent cycle (e.g., cycle n), then input data IN is moving from the left to the right passing time t5 or input data IN is later than clock OVCO. In contrast, if the sampling results reveal that input data IN is in the region IV (e.g., late_a and early_b) in cycle n−1 and in the region III (e.g., early_a and early_b) in cycle n, then data IN is moving from the right to the left passing time t5 or input data IN is earlier than clock OVCO. Once the relationship is determined, appropriate signals (e.g., signals UP and DN in FIG. 7) are generated accordingly to increase or decrease the frequency of clock OVCO.

Exemplary Method

Figure 4:
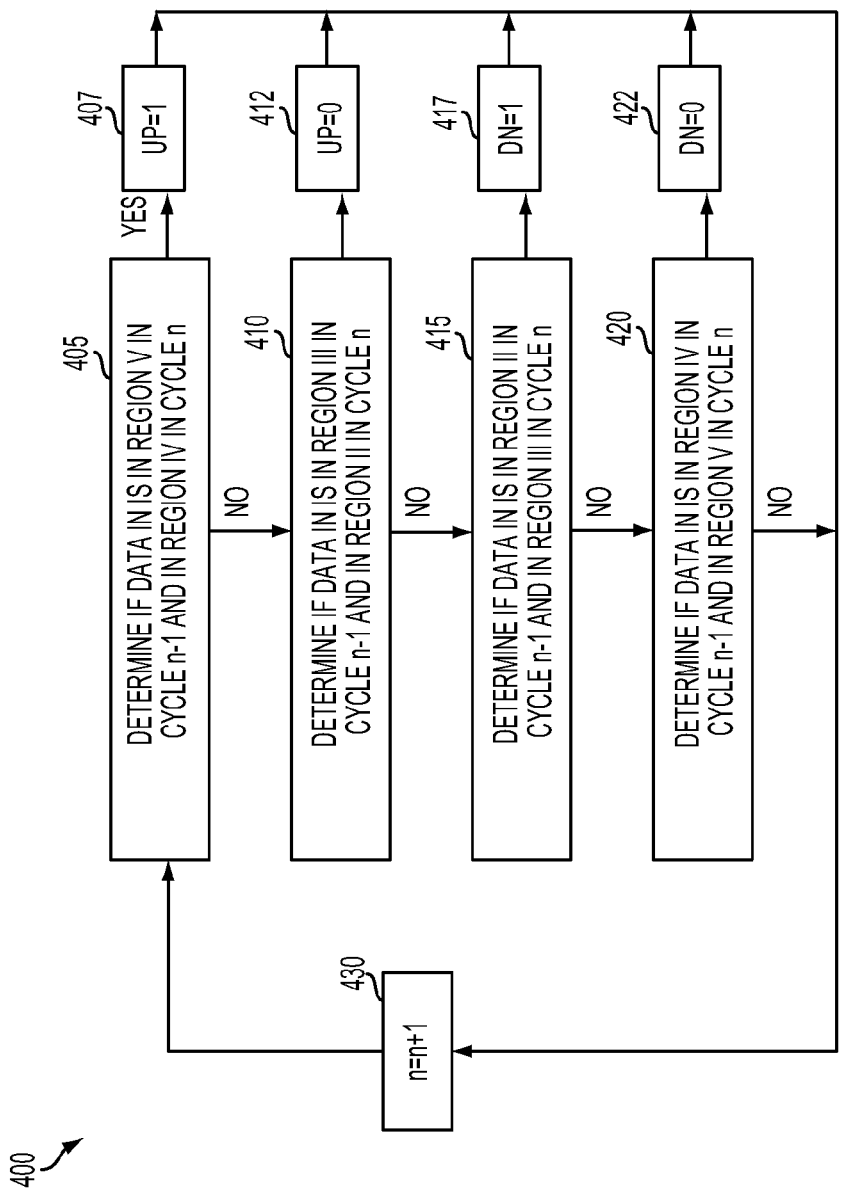
FIG. 4 is a flowchart illustrating how signals are generated to adjust the frequency of the output of the voltage-controlled oscillator in FIG. 1, in accordance with some embodiments.

FIG. 4 is a flowchart 400 illustrating how signals (e.g., signals UP and DN) are generated to increase/decrease the frequency of clock OVCO, in accordance with some embodiments. For illustration, regions I, II, III, IV, V correspond to the regions between times t2 and t3, t3 and t4, t4, and t5, t5 and t6, and t6 and t7, respectively. Alternatively expressed, regions I, II, III, IV, and V correspond to the regions late_a and late_b, early_a and late_b, early_a and early_b, late_a and early_b, and late_a and late_b, respectively.

In block 405, if condition 1 is true, that is, if input data IN is in region V (e.g., late_a and late_b) in clock cycle n−1 and in region IV (e.g., late_a and early_b) in clock cycle n, then input data IN is moving from the right to the left passing time t6, which indicates that clock OVCO is later than input data IN. As a result, phase lock assistance PLA in step 407 generates a logical "1" for the "UP" signal (FIG. 7) of signal OPLA so that charge pump PLA CP generates a corresponding signal OCP to increase frequency FVCO making clock OVCO faster. Method 400 then flows to step 430 where the clock cycle n is increased (e.g., n=n+1), or, stated another way, the clock proceeds to the next cycle.

If condition 1, however, is not true, then in step 410, if condition 2 is true, that is, if input data IN is in region III (e.g., early_a and early_b) in cycle n−1 and in region II (e.g., early_a and late_b) in cycle n, then input data IN is moving from the right to the left passing time t2, which indicates that clock OVCO has been aligned (e.g., phase locked) with data IN. As a result, phase lock assistant PLA in step 412 generates a logical "0" for the UP signal so that charge pump PLA CP generates a corresponding signal OCP to not increase frequency FVCO. Clock OVCO and input data IN are now aligned (e.g., phase locked).

In some embodiments, the method 400 loops through steps 405, 407, and 430 many times before proceeding to step 410 then step 412. Expressed differently, initially clock OVCO is later than input data IN, and it takes many clock cycles for input data IN to transition through regions IV and III before reaching region II or for PLA to increase frequency FVCO many times before data edge DE is aligned with the rising edge of clock Clk_90.

In block 415, if none of the condition 1 or condition 2 is true, and if condition 3 is true, that is, if input data IN is in region II (e.g., ealry_a and late_b) in clock cycle n−1 and in region III (e.g., early_a and early_b) in clock cycle n, then input data IN is moving from the left to the right passing time t2, which indicates that clock OVCO is earlier than input data IN. As a result, phase lock assistance PLA in step 417 generates a logical "1" for the "DN" signal (FIG. 7) of signal OPLA so that charge pump PLA CP generates a corresponding signal OCP to decrease frequency FVCO making clock OVCO slower. Method 400 then flows to step 430 where the clock proceeds to the next cycle.

If condition 3, however, is not true, then in step 420, if condition 4 is true, that is, if input data IN is in region IV (e.g., late_a and early_b) in cycle n−1 and in region V (e.g., late_a and late_b) in cycle n, then input data IN is moving from the left to the right passing time t6, which indicates that clock OVCO has been aligned with input data IN. As a result, phase lock assistant PLA in step 412 generates a logical "0" for the DN signal so that charge pump PLA CP generates a corresponding signal OCP to not decrease frequency FOVCO. Clock OVCO and data IN are now aligned (e.g., phase locked).

In some embodiments, the method 400 loops through steps 415, 417, and 430 many times before proceeding to step 420 then step 422. Expressed differently, initially clock OVCO is earlier than input data IN, and it takes many clock cycles for input data IN to transition through regions III and IV before reaching region V or for PLA to decrease frequency FOVCO many times before data edge DE is aligned with the rising edge of clock Clk_90.

The Phase Detector Circuit

Figure 5:
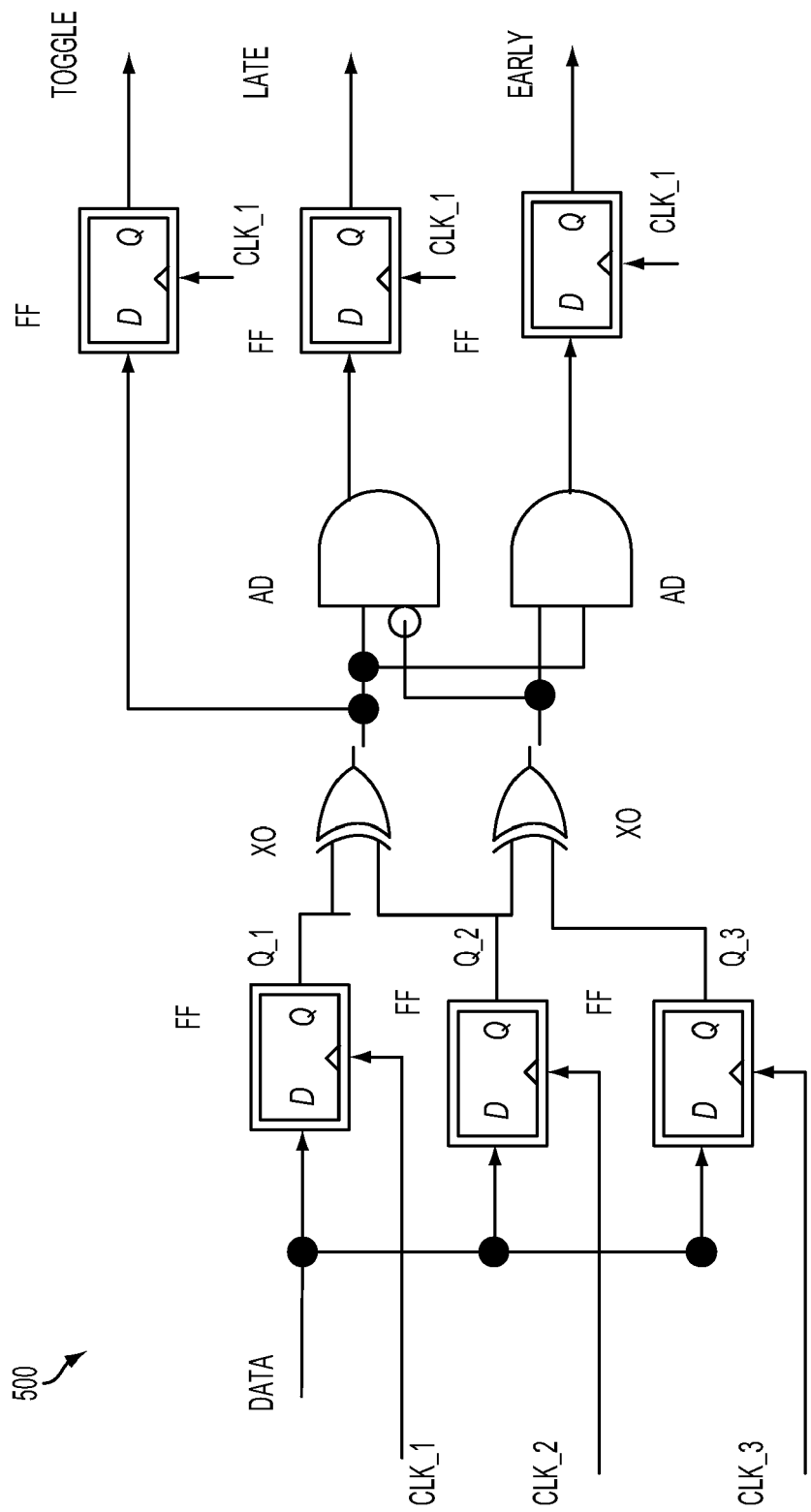
FIG. 5 is a diagram of a detailed circuit of the phase detector of FIG. 1, in accordance with some embodiments.

FIG. 5 is a detailed schematic diagram 500 of phase detector PD (e.g., PD 500) in accordance with some embodiments. Flip-flops FF, Exclusive-OR gates XO and AND gates AD are means for PD 500 to use clocks Clk_1, Clk_2, and Clk_3 to sample data Data and generates signals Late and Early as illustrated in FIG. 2. Clocks Clk_2 and Clk_3 are 180° and 90° out of phase with clock Clk_1, respectively. If the sampling result of clock Clk_3 is the same as the sampling result of clock Clk_2, then clock Clk_1 is later than Data, and signal Late is generated (e.g., high). But if the sampling result of clock Clk_3 is the same as the sampling result of clock Clk_1, then clock Clk_1 is earlier than Data and signal Early is generated "true." If signal Early is true, then charge pump PD CP generates an "dn" signal OCP for low pass filter LPF to decrease frequency FVCO, but if signal Late is true, then charge pump PD CP generates a "up" signal OCP for low pass filter to increase frequency FVCO.

Figure 7:
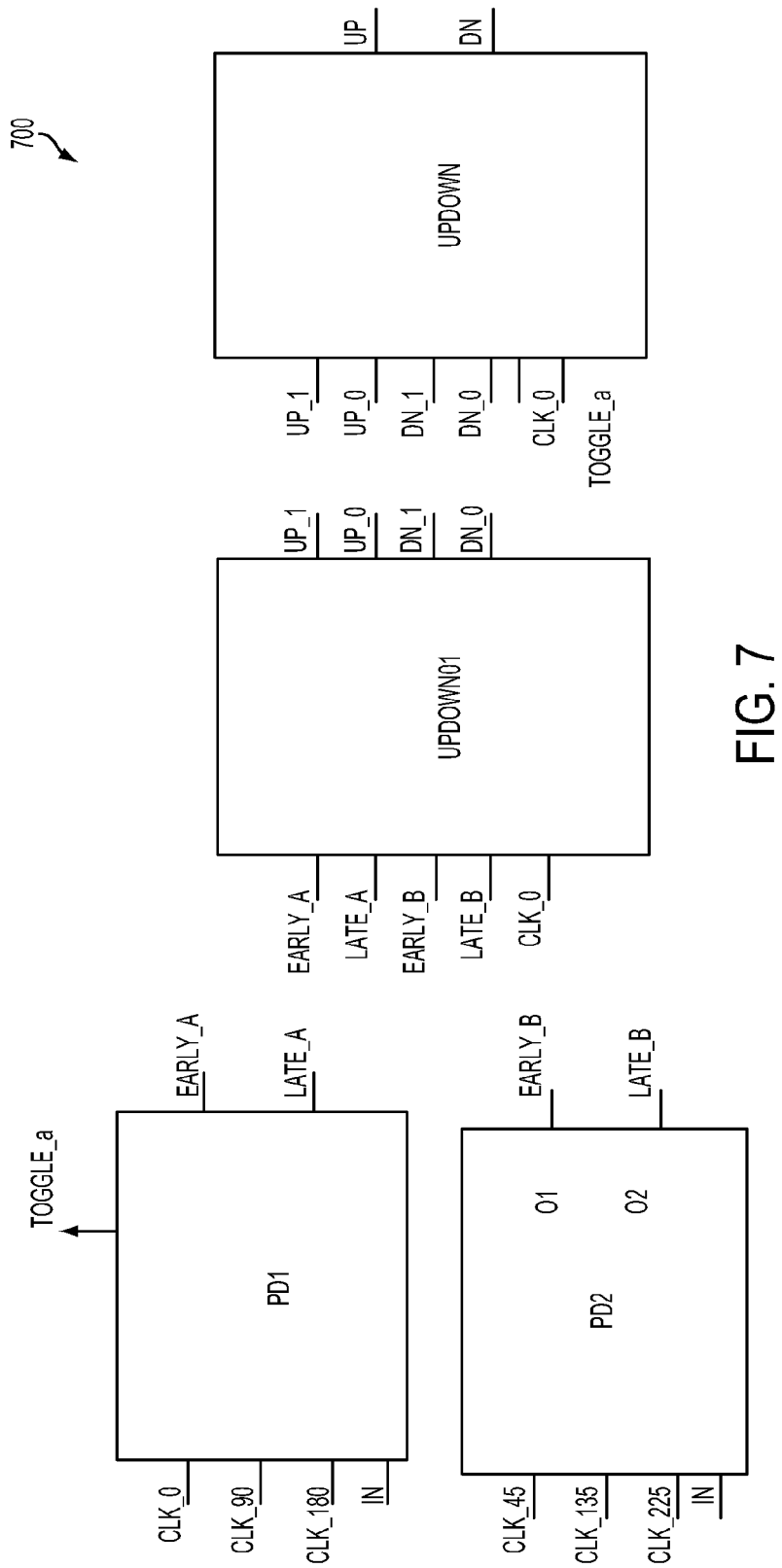
FIG. 7 is a detailed block diagram of the phase lock assistant of FIG. 1, in accordance with some embodiments.

In some embodiments, PD 500 is also used in phase lock assistant PLA (FIG. 7). Consequently, clocks Clk_1, Clk_2, and Clk_3 correspond to clocks Clk_0, Clk_180, and Clk_90, data Data correspond to input data IN and signals Late and Early correspond to the respective regions late_a, early_a in FIG. 3. As a result, signals (e.g., signals late_A and early_A) are generated corresponding to the regions late_a and early_a, respectively, based on the results of clocks Clk_0, Clk_90, and Clk_180 sampling input data IN. In some further embodiments, clocks Clk_1, Clk_2, and Clk_3 correspond to clocks Clk_45, Clk_225, and Clk_135, data Data correspond to input data IN and signals Late and Early correspond to the respective regions late_b, early_b in FIG. 3. As a result, signals (e.g., signals late_B and early_B) are generated corresponding to the regions late_b and early_b, respectively, based on the results of clocks Clk_45, Clk_135, and Clk_225 sampling input data IN.

In some embodiments, PD 500, based on signals Q_1 and Q_2, also generates signal Toggle for use in FIG. 7 below.

FIGS. 6A-6D show truth tables 600A-D illustrating an operation of PD 500 of FIG. 5 in accordance with some embodiments. Truth tables 600A-C illustrate the operation of the respective outputs Q_1, Q_2, and Q_3 having data Data and the respective clocks Clk_1, Clk_2, and Clk_3 as inputs. In tables 600A, 600B, and 600C, the respective outputs Q_1, Q_2, and Q_3 follow the input Data at the rising edge of the respective clocks Clk_1, Clk_2, and Clk_3, and are unchanged otherwise. Truth table 600D shows the operation of signals Late and Early having signals Q_1, Q_2, and Q_3 and Clk_1 as inputs. Signals Late, Early, and Toggle are unchanged when clock Clk_1 is at a constant level Low or High, and are at a logic level Low or High at the rising edge of clock Clk_1 as shown in the table.

The Phase Lock Assistant Circuit

FIG. 7 is a block diagram 700 of phase lock assistant PLA (e.g., PLA 700) in accordance with some embodiments. In some embodiments, phase detector PD1 and PD2 are implemented using PD 500. Phase detector PD1 uses clocks Clk_0, Clk_90, and Clk_180 to sample input data IN and generate signals early_A and late_A corresponding to the regions early_a and late_a as illustrated in FIGS. 2 and 5. Phase detector PD2 uses clocks Clk_45, Clk_135, and Clk_225 to sample input data IN and generate signals early_B and late_B corresponding to the regions early_b and late_b as illustrated in FIGS. 2 and 5. Clocks Clk_45, Clk_135, and Clk_225 correspond to clocks Clk_0, Clk_90, and Clk_180, and clocks Clk_1, Clk_3, and Clk_2, respectively. Additionally, phase detector PD1 generates signal Toggle_a to activate circuit UPDOWN and thus signals UP and DN when input data IN is transitioning (e.g., from a low to a high or from a high to a low).

Circuit UPDOWN01 receives input signals early_A, late_A, early_B, late_B, and clock Clk_0 as inputs and generates outputs Up_1, Up_0, Dn_1, and D_0. In some embodiments, circuit UPDOWN01 includes combinatorial logic circuitry. In some further embodiments, circuit UPDOWN01 is a state machine.

Circuit UPDOWN receives input signals Up_1, Up_0, Dn_1, Dn_0, and Toggle_a, and generates signal UP and DN.

Figure 8:
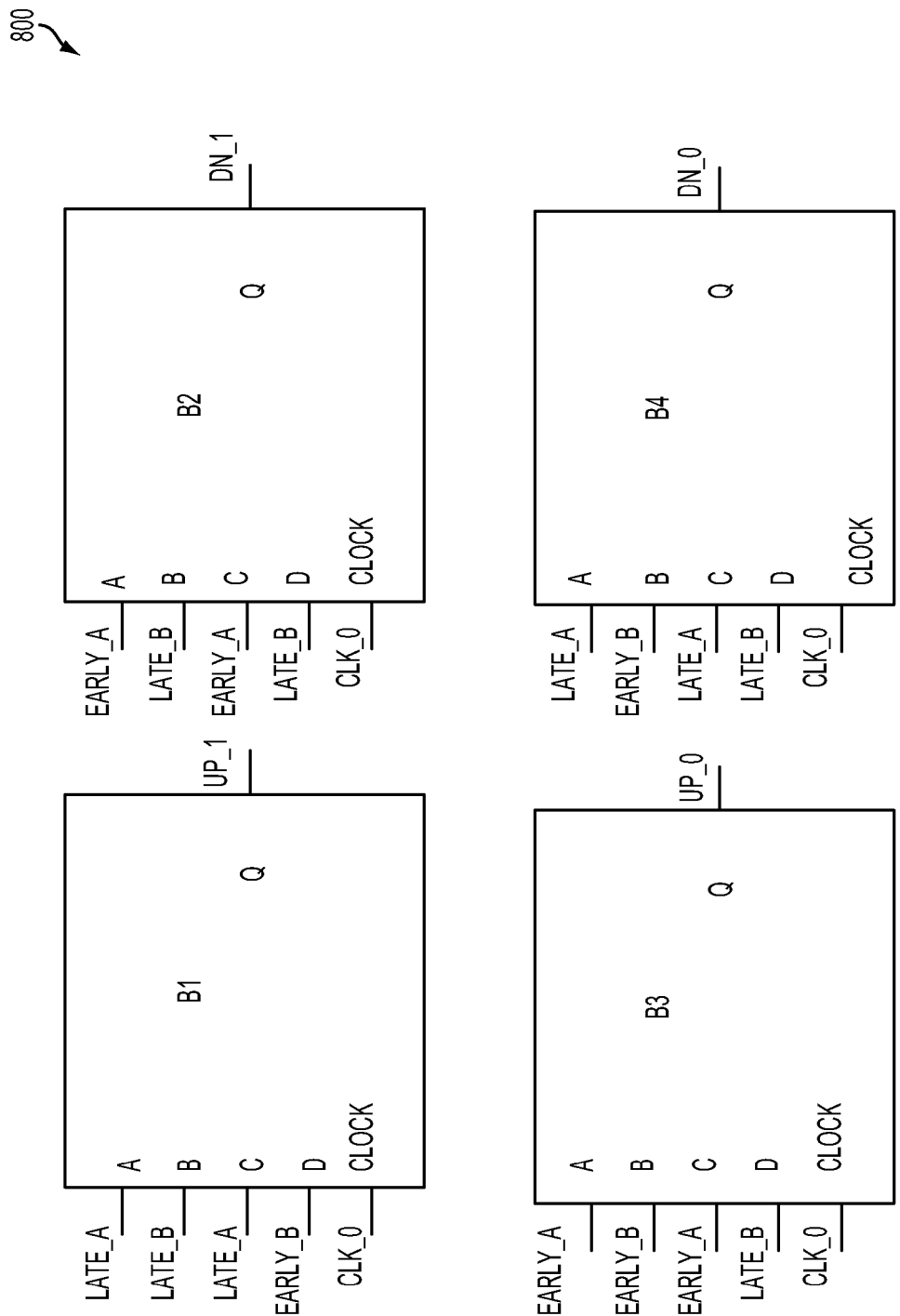
FIG. 8 is a detailed block diagram of the circuit UPDOWN01 of FIG. 7, in accordance with some embodiments.

FIG. 8 is a block diagram 800 illustrating a detailed diagram of circuit UPDOWN01 in FIG. 7, in accordance with some embodiments.

Circuits B1, B2, B3, and B4 generate signals Up_1, Dn_1, Up_0, and Dn_0, respectively. Each circuit B1, B2, B3, and B4 is implemented from a circuit "BB" (shown in FIG. 9 below) having the same input terminals A, B, C, D, and clock, and generating an output Q. As a result, circuits B1, B2, B3, and B4 function in the same way except that they each receive different inputs at their input terminals and generate different outputs at respective output terminals Q. For example, circuit B1 receives inputs Late_A, Late_B, Late_A, and Early_B at the respective terminals A, B, C, and D, and generates signal Up_1. Circuit B2 receives inputs Early_A, Late_B, Early_A, and Late_B at the respective terminals A, B, C, and D, and generates signal Dn_1 at the respective output terminal Q, etc. In some embodiments, each circuit B1, B2, B3, and B4 is a state machine.

Figure 9:
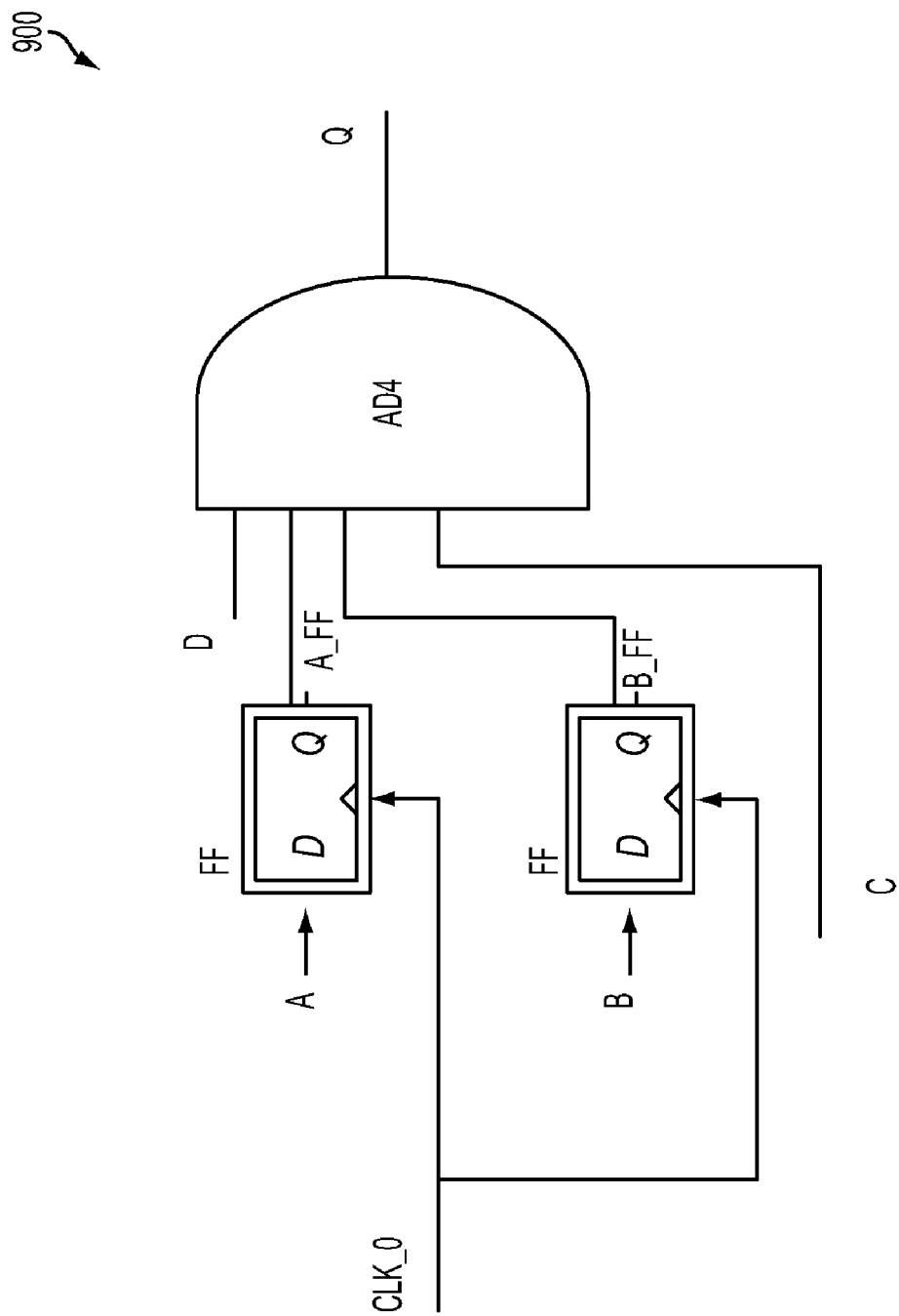
FIG. 9 is a detailed circuit of circuit BB of FIG. 8, in accordance with some embodiments.

FIG. 9 is a detailed diagram 900 illustrating an implementation of a circuit BB of FIG. 8, in accordance with some embodiments. Nodes A_FF and B_FF are the internal outputs of circuit 900 (e.g., the outputs of the respective flip flops FF). Circuit 900 receives inputs A, B, C, and D and clock Clk_0, and, using flip-flops FF and a four-input AND gate AD4, generates an output Q.

FIGS. 10A-10C show the truth tables 1000A, 1000B, and 1000C illustrating an operation of circuit BB in FIG. 9, in accordance with some embodiments. In table 1000A, output A_FF depends on input signal A and clock Clk_0. In some embodiments, at the rising edge of clock Clk_0, output A_FF follows input A (e.g., output A_FF is High if input A is High, and output A_FF is Low if input A is Low). When clock Clk_0 is at a constant level (e.g., Low or High), output A_FF is unchanged. Similarly, in table 1000B, output B_FF depends on input signal B and clock Clk_0. In some embodiments, at the rising edge of clock Clk_0, output B_FF follows input B (e.g., output A_FF is High if input A is High, and output B_FF is Low if input A is Low). When clock Clk_0 is at a constant level (e.g., Low or High), output A_FF is unchanged. In table 1000C, output Q depends on signals A_FF, B_FF, C, and D. Output Q is High when all signals A_FF, B_FF, C, and D are high. Otherwise, output Q is low.

Figure 11:
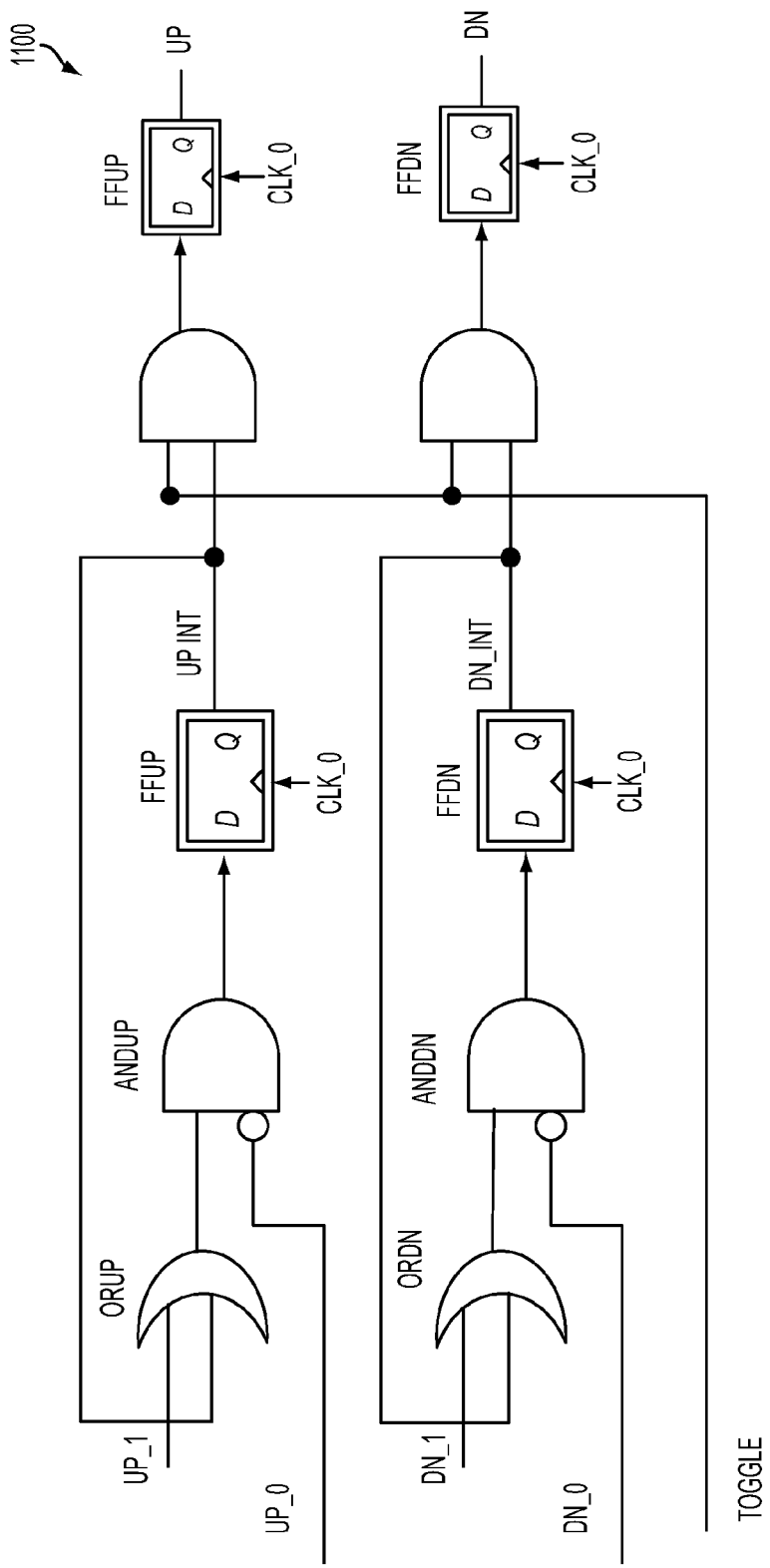
FIG. 11 is a detailed circuit of the circuit UPDOWN in FIG. 7, in accordance with some embodiments.

FIG. 11 is a detailed diagram 1100 of circuit UPDOWN in FIG. 7 (e.g., circuit 1100), in accordance with some embodiments. Signal UP is generated based on signals Up_0 and Up_1 passing through OR gate ORUP and AND gate ANDUP and flip-flops FFUP. Similarly, signal DN is generated based on signals Dn_0 and Dn_1 passing through OR gate ORDN and AND gate ANDDN and flip-flops FFDN. Signals UP and DN are activated when signal Toggle_a is activated (e.g., high, when input data IN is transitioning).

FIGS. 12A-12D show truth tables 1200A, 1200B, 1200C, and 1200D illustrating an operation of circuit 1100 in accordance with some embodiments. In table 1200A, signal UP_int depends on signals Up_0, Up_1, and clock Clk_0. Signal UP_int is unchanged when clock Clk_0 is at a constant level (e.g., Low or High) or both signals Up_0 and Up_1 are Low. At the rising edge of clock Clk_0 signal UP_int is Low when signal Up_0 is High, and signal UP_int is High when signals UP_0 and UP_1 are Low and High, respectively. In table 1200B, signal UP depends on signals UP_int, Toggle, and Clk_0. Signal UP is unchanged when clock Clk_0 is at a constant level High or Low. At the rising edge of clock Clk_0, signal UP is High when both signals UP_int and Toggle are High, and is Low otherwise.

In table 1200C, signal DN_int depends on signals Up_0, Up_1, and clock Clk_0. Signal DN_int is unchanged when clock Clk_0 is at a constant level Low or High, or both signals Dn_0 and Dn_1 are Low. At the rising edge of clock Clk_0 signal DN_int is Low when signal Dn_0 is High, and signal DN_int is High when signals DN_0 and DN_1 are Low and High, respectively. In table 1200D, signal DN depends on signals DN_int, Toggle, and Clk_0. Signal DN is unchanged when clock Clk_0 is at a constant level High or Low. At the rising edge of clock Clk_0, signal DN is High when both signals DN_int and Toggle are High, and is Low otherwise.

A number of embodiments have been described. It will nevertheless be understood that various modifications may be made without departing from the spirit and scope of the invention. The above method embodiments show exemplary steps, but they are not necessarily performed in the order shown. Steps may be added, replaced, changed order, and/or eliminated as appropriate, in accordance with the spirit and scope of the disclosed embodiments. Each claim of this document constitutes a separate embodiment, and embodiments that combine different claims and/or different embodiments are within the scope of the disclosure and will be apparent to those of ordinary skill in the art after reviewing this disclosure.

What is claimed is:

1. A method for a circuit having a phase lock assistant circuit that receives an input signal and a feedback clock signal having a first phase, a second phase, a third phase, a fourth phase, and fifth phase, and a sixth phase corresponding to a first phase clock, a second phase clock, a third phase clock, a fourth phase clock, a fifth phase clock, and a sixth phase clock, respectively, the method comprising:

using the first phase clock, the third phase clock and the fifth phase clock to sample the input signal and generate a first relationship between the feedback clock signal and the input signal and a second relationship between the feedback clock signal and the input signal;

using the second phase clock, the fourth phase clock, and the sixth phase clock to sample the input signal and generate a third relationship between the feedback clock signal and the input signal and a fourth relationship between the feedback clock signal and the input signal; and generating a fifth relationship between the feedback clock signal and the input signal based on the first relationship, the second relationship, the third relationship and the fourth relationship;

wherein the first phase, the second phase, the third phase, the fourth phase, the fifth phase and the sixth phase are in an order of phase degree.

2. The method of claim 1 wherein the first phase, the second phase, the third phase, the fourth phase, the fifth phase and the sixth phase are at phases of 0°, 45°, 90°, 135°, 180°, are at 225°, respectively.

3. The method of claim 1 wherein generating the fifth relationship comprises:
generating the first relationship based on a result of the first phase clock sampling the input signal and a result of the third phase clock sampling the input signal;
generating the third relationship based on a result of the fifth phase clock sampling the input signal and the result of the third phase clock sampling the input signal;
generating the second relationship based on a result of the second phase clock sampling the input signal and a result of the fourth phase clock sampling the input signal; and
generating the fourth relationship based on a result of the sixth phase clock sampling the input signal and the result of the fourth phase clock sampling the input signal.

4. The method of claim 1 further comprising:
generating a first state of a signal if the second relationship and the fourth relationship occurs in a first clock cycle and the second relationship and the third relationship occur in a second clock cycle subsequent to the first clock cycle; and
generating a second state of the signal if the first relationship and the third relationship occur in a third clock cycle and the first relationship and the fourth relationship occur in a fourth cycle subsequent to the third clock cycle;
wherein the third clock cycle is subsequent to the second clock cycle.

5. The method of claim 1 further comprising:
generating a second state of a signal if the first relationship and the fourth relationship occur in a first clock cycle and the first relationship and the third relationship occur in a second clock cycle subsequent to the first clock cycle; and
generating a second state of the signal if the second relationship and the third relationship occur in a third clock cycle and the second relationship and the fourth relationship occur in a fourth cycle subsequent to the third clock cycle;
wherein the third clock cycle is subsequent to the second clock cycle.

6. A circuit comprising:
a first circuit configured to lock a frequency of an output clock to a frequency of a reference clock;
a second circuit configured to align an input signal to a phase clock of the output clock;
a third circuit configured to use a first set of phase clocks of the output clock and a second set of phase clocks of the output clock to improve alignment of the input signal to the phase clock of the output clock; and
a lock detection circuit configured
to turn on the first circuit when the frequency of the output clock is not locked to the frequency of the reference clock; and
to turn off the first circuit and to turn on the second circuit and the third circuit when the frequency of the output clock is locked to the frequency of the reference clock.

7. The circuit of claim 6 wherein the third circuit comprises:
a fourth circuit configured to receive the first set of phase clocks and the input signal and generate a first early signal indicating the output clock is earlier than the input signal and a first late signal indicating the output clock is later than the input signal; and
a fifth circuit configured to receive the second set of phase clocks and the input signal and generate a second early signal indicating the output clock is earlier than the input signal and a second late signal indicating the output clock is later than the input signal.

8. The circuit of claim 7 wherein the third circuit further comprises:
a sixth circuit configured to receive the first early signal, the first late signal, the second early signal, the second late signal, a clock in the first set of phase clocks to generate a first up signal corresponding to a first state of a first signal, a second up signal corresponding to the second state of the first signal, a first down signal corresponding to a first state of a second signal, and second down signal corresponding to a second state of the second signal; and
a seventh circuit configured to receive the first up signal, the second up signal, the first down signal, the second down signal, the clock in the first set of phase clocks, and a toggle signal generated by the fourth circuit to generate the first signal and the second signal.

9. The circuit of claim 7 wherein
the fourth circuit is configured to generate the first early signal when a first result of a first clock of the first set of phase clocks sampling the data is the same as a second result of a second clock of the first set of phase clocks sampling the data and generate the first late signal when the second result is the same as a third result of a third clock of the first set of phase clocks sampling the data, and
the fifth circuit is configured to generate the second early signal when a first result of a first clock of the second set of phase clocks sampling the data is the same as a second result of a second clock of the second set of phase clocks sampling the data and generate the first late signal when the second result of the second clock of the second set of phase clocks sampling the data is the same as a third result of a third clock of the second set of phase clocks sampling the data.

10. The circuit of claim 6 wherein
the first set of phase clocks includes a 0° phase clock, a 90° phase clock, and a 180° phase clock, and
the second set of phase clocks includes a 45° phase clock, a 135° phase clock, and a 225° phase clock.

11. The circuit of claim 10 wherein
the third circuit is configured to use the 0° phase clock, the 90° phase clock, and the 180° phase clock to generate a first early signal indicating the output clock is earlier than the input data and a first late signal indicating the output clock is later than the input data, and the third circuit is configured to use the 45° phase clock, the 135° phase clock, and the 225° phase clock to generate a second early signal indicating the output clock is earlier than the input data and a second late signal indicating the output clock is later than the input data.

12. The circuit of claim 11 wherein the third circuit is configured to use the first early signal, the first late signal, the second early signal, the second late signal, and the 0° phase clock to generate a first signal and a second signal used to improve the alignment of the input signal to the phase clock of the output clock.

13. The circuit of claim 6 wherein the third circuit is configured to improve the alignment of the input signal to the phase clock of the output clock by increasing a frequency of the output clock if the output clock is slower than the input signal and by decreasing the frequency of the output clock if the output clock is faster than the input signal.

14. The circuit of claim 13 further comprising a charge pump circuit configured to receive an output signal of the third circuit to increase the frequency of the output clock if the output clock is slower than the input signal and to decrease the frequency of the output clock if the output clock is faster than the input signal.

15. The circuit of claim 14 further comprising a low pass filter circuit configured to receive an output signal of the charge pump circuit to increase the frequency of the output clock if the output clock is slower than the input signal and to decrease the frequency of the output clock if the output clock is faster than the input signal.

16. A circuit comprising:
 a first circuit configured to receive an input signal and first phase, third phase, and a fifth phase clocks of a clock, and generate a first early signal indicating the clock is earlier than the input signal and a first late signal indicating the clock is later than the input signal;
 a second circuit configured to receive the input signal and second phase, fourth phase, and sixth phase clocks of the clock, and generate a second early signal indicating the clock is earlier than the input signal and a second late signal indicating the clock is later than the input signal; the first phase clock, the second phase clock, the third phase clock, the fourth phase clock, the fifth phase clock and the sixth phase clock are in an order of phase degree; and a third circuit configured to receive the first early signal, the first late signal, the second early signal, the second late signal, and the first phase clock, and generate a first signal and a second signal that are used to align the input signal and the clock;
 the first circuit is configured to use the first phase clock to sample the input signal and result in a first phase clock result, to use the third phase clock to sample the input signal and result in a third phase clock result, to use the fifth phase clock to sample the input signal and result in a fifth phase clock result, and to generate the first early signal when the first phase clock result is the same as the third phase clock result, and to generate the first late signal when the fifth phase clock result is the same as the third phase clock result; and
 the second circuit is configured to use the second phase clock to sample the input signal and result in a second phase clock result, to use the fourth phase clock to sample the input signal and result in a fourth phase clock result, to use the sixth phase clock to sample the input signal and result in a sixth phase clock result, and to generate the second early signal when the second phase clock result is the same as the fourth phase lock result, and to generate the second late signal when the sixth phase clock result is the same as the fourth phase clock result.

17. The circuit of claim 16 wherein the third circuit comprises:
 a fourth circuit configured to receive the first early signal, the first late signal, the second early signal, the second late signal, and the first phase clock and generate a first up signal, a second up signal, a first down signal, and a second down signal; and
 a fifth circuit configured to receive the first up signal, the second up signal, the first down signal, the second down signal, the first phase clock, and a toggle signal generated by the first circuit, and generate the first signal and the second signal.

18. The circuit of claim 16 wherein the first phase clock, the second phase clock, the third phase clock, the fourth phase clock, the fifth phase clock and the sixth phase clock are 0°, 45°, 90°, 135°, 180°, and 225° phase clocks, respectively.

19. The circuit of claim 16 wherein the clock is a feedback clock.

\* \* \* \* \*